United States Patent [19]

Bray

[11] 4,068,139

[45] Jan. 10, 1978

[54] IC COMPATIBLE VARIABLE SHUNT IMPEDANCE FOR DOLBY B SYSTEM

[75] Inventor: Derek Bray, Los Altos, Calif.

[73] Assignee: Fairchild Camera and Instrument Corporation, Mountain View, Calif.

[21] Appl. No.: 710,958

[22] Filed: Aug. 9, 1976

[51] Int. Cl.² .................... H04B 1/64; H03G 7/06; H03K 1/14

[52] U.S. Cl. .................... 307/264; 328/162; 328/167; 179/1 P; 333/14

[58] Field of Search .............. 333/14, 17; 179/1 P; 328/162, 163, 167; 307/264

[56] References Cited

U.S. PATENT DOCUMENTS

| | | | |
|---|---|---|---|
| 3,729,693 | 4/1973 | Dolby | 333/14 |
| 3,829,715 | 8/1974 | Van Sluys | 307/264 |
| 3,873,945 | 3/1975 | Muraoka | 333/14 |
| 3,875,537 | 4/1975 | Dolby | 333/14 |

*Primary Examiner*—Stanley D. Miller, Jr.

*Attorney, Agent, or Firm*—Alan H. MacPherson; Henry K. Woodward; Norman E. Reitz

[57] ABSTRACT

A current variable shunt impedance with a non-linear control characteristic intended to functionally imitate and replace a field effect transistor responsive to a control voltage applied to its gate electrode having a source-drain path connected as a variable impedance shunt resistor in the variable frequency high pass filter section of the commercially popular Dolby B noise reduction system. The invention allows a large part of the Dolby B encode decode circuitry to be embodied in low-cost integrated circuit form while maintaining performance characteristics which closely match existing standards. These standards were previously established using noise reduction systems fabricated from discrete circuit components. The complementary nature of the encode and decode operations used to process a signal makes such matching of performance characteristics to the established standards critical.

5 Claims, 10 Drawing Figures

IC COMPATIBLE VARIABLE SHUNT IMPEDANCE FOR DOLBY B SYSTEM

BACKGROUND OF THE INVENTION

1. Field of the Invention

This invention relates generally to current variable shunt impedances with non-linear control characteristics and specifically to such an impedance intended to functionally imitate and replace a control voltage responsive field effect transistor commonly employed in the Dolby B noise reduction system.

2. Description of the Prior Art

Added quality in reproduced sound has long been important to the ever-growing ranks of home high fidelity enthusiasts. Twenty years ago, high-fidelity sound equipment for home use was produced by relatively few manufacturers for a limited market. Today, a host of manufacturers vigorously compete with extensive product lines to satisfy diverse segments of a large and complex market. The directions in which the consumer high-fidelity sound equipment industry grew were dictated in large measure by a few significant technical innovations. The most important of these innovations have brought improved sound quality at modest cost to large segments of the public. For example, the 33 33⅓ rpm long-play record greatly improved the quality of recorded sound compared to the older 78 rpm records and spawned a new generation of manual and automatic turntables.

Pre-recorded reel-to-reel magnetic tapes and simultaneous AM/FM radio broadcasts provided the first widespread public opportunity for high-fidelity enthusiasts to sample and enjoy the added dimension of stereophonic sound. Stereo was warmly received by consumers and soon after its introduction a host of two-channel amplifiers and radios designed to receive AM and FM broadcasts simultaneously appeared. Pleasant though this early stereophonic sound may have been, the cost of pre-recorded reel-to-reel magnetic tape was high and the fidelity available with AM broadcasting techniques was limited.

The introduction of stereophonic records brought the cost of stereophonic sound within the easy reach of much of the public. Monophonic compatible FM multiplex broadcasting techniques were developed and standarized by the Federal Communications Commission. These techniques allowed two distinct stereophonic signals to be combined, broadcast simultaneously and separated electronically by AM radio equipped with a multiplex adapter. These developments in recording and broadcasting caused a wide variety of new high-fidelity sound equipment to be produced. However, they did not end the quest for quality in sound reproduction. Although stereo records are capable of providing excellent fidelity when new, they tend to develop surface noise with prolonged use and are limited in that they can only be played on stable, stationary equipment. Similarly, FM multiplex radios are also capable of providing excellent fidelity under optimum conditions. However, with weak signals, an unfavorable signal to transmission noise ratio results in the presence of objectionable carrier noise.

About ten years ago, the now ubiquitous tape cassette was introduced. Although not originally intended as a high fidelity medium, its popularity as a medium for portable tape recorders, dictating equipment, telephone answering equipment, selected digital systems applications and the like was predictable. The relatively slow tape transport speed of 1⅞ inches per second was originally though too slow to provide adequate frequency response for high fidelity sound applications. Additionally, the high level of tape hiss associated with casettes was also viewed as a significant limitation. Nevertheless, the relative low cost and high convenience of the cassette combined with its ability to be used in portable or mobile equipment, such as car stereo tape players, encouraged record manufacturers to offer prerecorded selections on cassettes.

In the late 1960's work was in progress on the development of novel signal compression and expansion techniques for reducing noise, such as the hiss associated with magnetic tape recording. The idea of signal compression and complementary expansion can be used to reduce noise in a wide variety of signal transmission applications. A specific noise reducing signal processing system was developed for consumer audio products and became known as the Dolby B system. This system is substantially shown and described in U.S. Pat. No. Re. 28,426 reissued May 20, 1975 to R. M. Dolby and entitled "Signal Compressors and Expanders." A more general teaching of noise reduction art can be found in U.S. Pat. No. 3,846,719 issued Nov. 5, 1974 to R. M. Dolby and entitled "Noise Reduction Systems."

When the Dolby B noise reduction system is used in combination with a high quality cassette recorder and magnetic recording tape possessing low noise and high output characteristics, such as for example, chromium dioxide tape, sound quality almost indistinguishable from that obtainable with new 33⅓ rpm long-play records is achieved with all the advantages associated with cassettes. Many manufacturers now produce such cassette tape decks equipped with Dolby B circuitry and these machines sell well in the marketplace.

Once a signal has been compressed (encoded) and recorded according to Dolby B standards, a complementary expander (decoder) must be employed to recover an undistorted signal. However, to the uncritical ear, the only noticeable defect in the compressed signal is an undue emphasis of high frequencies. This emphasis can be approximately corrected by a simple, passive treble cut circuit which acts upon the entire signal. This feature allows Dolby B encoded audio signals to be compatible with audio equipment not provided with Dolby B decoding circuitry.

The Dolby B noise reduction system has performed so well in reducing tape hiss that the Federal Communications Commission has recently authorized its use to reduce transmission noise in FM broadcast signals. As mentioned above, a signal encoded in accordance with the Dolby B standards can be listened to without decoding. Therefore, Dolby B encoded FM broadcast signals are compatible with existing FM and FM stereo radios.

One major obstacle confronting equipment manufacturers who wish to incorporate the Dolby B noise reduction system in new tape recorders, FM radios and the like is the nature of the now-standardized complementary encode/decode characteristics. These standards were previously established using noise reduction systems fabricated from discrete circuit components. Consumer audio equipment manufacturers currently have two choices in implementing Dolby B noise reduction in their products. Discrete component circuitry can be employed which provides perfect matching with existing performance standards. However, this choice is expensive, space consuming and requires initial system adjustments. Alternatively, manufacturers can elect to use the Signetics Integrated Circuit (IC) part No. NE545. When compared to discrete components, the Signetics IC offers the advantages of lower cost, increased reliability, lower space requirements and absence of initial adjustments. However, the encode and decode characteristics of the Signetics part do not conform closely under both static and dynamic conditions with established Dolby B standards. This failure to match the established standards introduces distortions when a properly encoded signal is decoded. These distortions will occur, for example, when pre-recorded cassettes are played or when properly encoded FM broadcast signals are decoded.

As will be described in more detail hereinbelow, the basic Dolby B circuit uses a variable frequency filter controlled by a variable resistance element in a high pass filter configuration. In the original commercial embodiment of this system, a discrete junction Field Effect Transistor (FET) was used as the variable resistance element. Control of the FET was achieved by means of a DC control voltage derived from a rectified audio signal. In attempting to match the standardized Dolby B characteristics, the Signetics IC substitutes a current variable shunt impedance for the junction FET. Such an impedance is taught in U.S. Pat. No. 3,761,741 issued Sept. 25, 1973 to Werner H. Hoeft and entitled "Electrically Variable Impedance Utilizing the Base Emitter Junctions of Transistors."

As a practical matter, many manufacturers of intermediate quality tape recorders and FM radios have found the distortions introduced through the use of the Signetics IC far outweighed by its associated advantages and have incorporated this part in their products. Nonetheless, manufacturers of high quality tape recorders and FM radios must still incorporate the Dolby B noise reduction circuitry in costly discrete component form.

SUMMARY OF THE INVENTION

The present invention overcomes many of the difficulties associated with prior art commercial embodiments of the Dolby B noise reduction system thereby enabling improved sound quality to be brought at modest cost to large segments of the public. It does so by providing a current variable shunt impedance with a non-linear control characteristic intended to functionally imitate and replace an FET responsive to a control voltage applied to its gate electrode having a source-drain path connected as a variable impedance shunt resistor at an output terminal of a variable frequency high pass filter in the Dolby B system. The current variable shunt impedance with a non-linear control characteristic includes variable shunt means connected at the output terminal of the variable frequency high pass filter for providing a selected impedance in substantially linear inverse response to a control current flowing through a control terminal; and non-linear voltage to current converter means coupled to the control voltage for providing the selected control current at the control terminal such that the selected impedance provided by the variable shunt means approximates the source-drain impedance of the replaced FET for a selection control voltage over an operable range of control voltage values.

The invention is particularly well suited for embodiment as an integrated circuit in a chip of semiconductor material. When so embodied, the invention allows a large part of the Dolby B encode/decode circuitry to be embodied in low cost integrated circuit form while maintaining performance characteristics which closely match existing standards. Such matching of performance characteristic to establish standards is critical because of the complementary nature of the encode and decode operations used to process a signal.

BRIEF DESCRIPTION OF THE DRAWINGS

The many objects and advantages of the present invention will become apparent to those skilled in the art when the following description of the best mode contemplated for practicing the invention is read in conjunction with the accompanying drawings, wherein like reference characters refer to the same or similar elements, and in which.

DETAILED DESCRIPTION OF THE PREFERRED EMBODIMENT

The Dolby B noise reduction system is designed to reduce high frequency noise (hiss) in consumer tape recording equipment and FM broadcast receivers. This is accomplished by boosting low level, high frequency signals prior to recording (or transmission), and then attenuating the same signals in a complementary manner during playback; thus, during playback, high frequency noise is attenuated, while the desired signals, which were boosted before recording, are restored to their normal levels.

Figure 1:
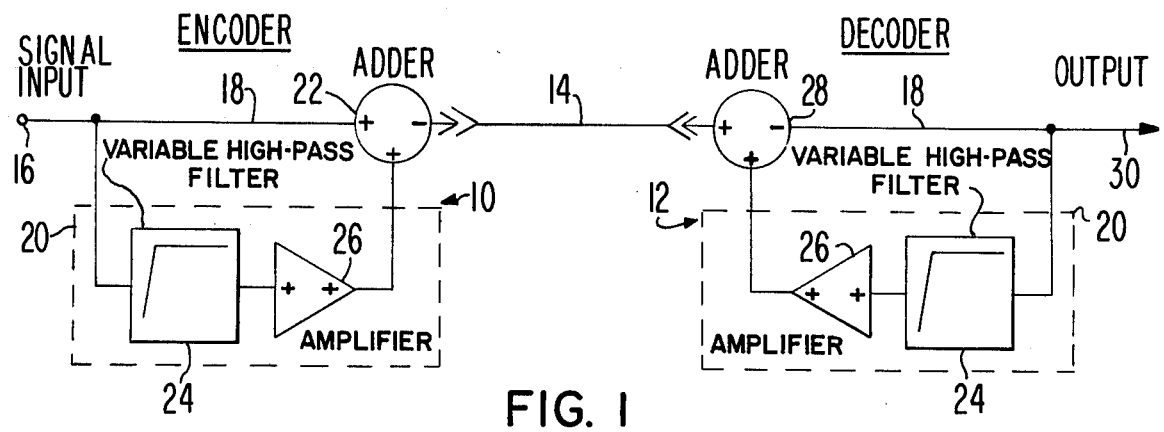
FIG. 1 is a simplified block schematic diagram of the Dolby B noise reduction system.

FIG. 1 is a simplified block schematic diagram of the Dolby B noise reduction system. The system includes an audio signal encoder 10 and a complementary audio signal decoder 12. An output signal from the encoder 10 is conveyed to the decoder 12 through a transmission channel 14. This channel can comprise for example, FM broadcasting and receiving equipment, magnetic tape recording and playback equipment or the like. In the encoder 10, an audio signal applied at a signal input terminal 16 is divided into two paths: a main path 18, and a noise reduction path, or side chain 20. The output from the side chain 20 is additively combined with the signal flowing through the main path 18 in an adder 22. The side chain 20 possesses a variable frequency high pass filter 24 and an amplifier 26. Selected high frequency signal components present at the signal input terminal 16 are boosted as much as 10db in the encoded output due to the contribution of the side chain 20. The encoder output then passes through the transmission channel 14, e.g., it is recorded and played back on a tape recorder, or broadcast in FM, and picked up through an FM radio. The complementary decoder 12 is similar to the encoder 10 except that the side chain 20 operates a feedback mode, rather than a feedforward mode as in the encoder 10. The adder 28 in the decoder 12 functions to subtract the output of the side chain 20 from the decoder input signal to produce an output signal on a line 30. Because the side chain 20 is the same in both the encoder 10 and the decoder 12, the selected high frequency signal components that were boosted in the encoder are attenuated in the decoder. This attenuation produces the original signal in the output line 30 and attenuates the high frequency noise introduced by the transmission channel 14 by approximately 10db.

Figure 2:
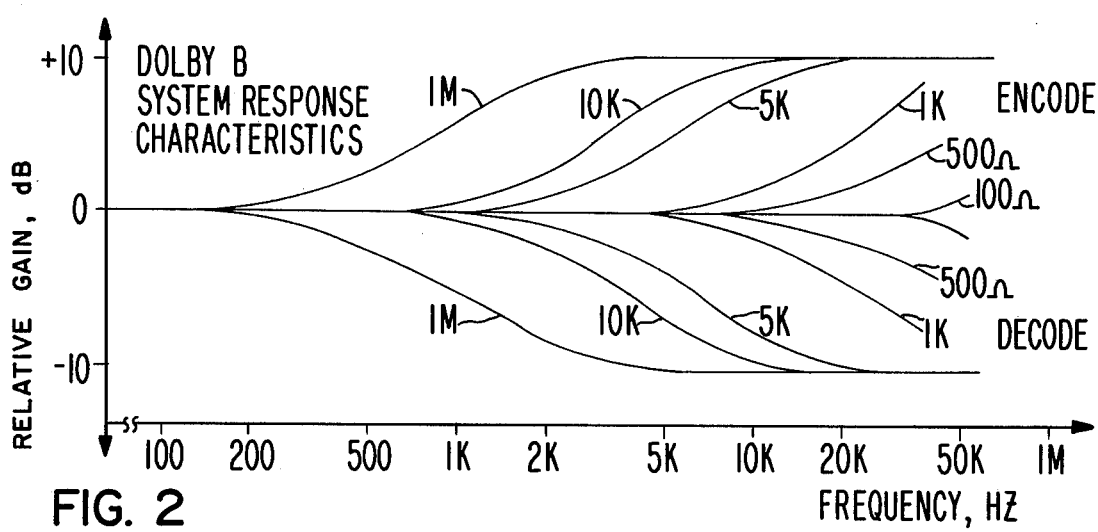
FIG. 2 is a graphical representation of selected complementary response characteristics for the FIG. 1 system.

The turnover frequency of the variable high pass filter 24 in the Dolby B system is controlled by a variable shunt impedance in the filter. The value that the variable shunt impedance assumed depends on the character of the audio signal passing through the filter. For example, when high level, high frequency signals are processed through the side chain 20, the value of the variable impedance decreases thereby increasing the turnover frequency of the high pass filter 24 such that these signals are not boosted. If the high level, high frequency signals were boosted, they might overload the transmission channel 14. Moreover, noise reduction is not necessary for signal components in the presence of high level signals because such signals will mask most of the transmission noise. However, full noise reduction action is preserved for low level signal components having frequencies above the new turnover frequency. A family of complementary encode/decode Dolby B noise reduction system response curves is shown in FIG. 2. Each complementary pair of curves show the system's overall response to low level signals of various frequencies in the presence of signal components whose character is such that the indicated impedance values are produced in the variable shunt impedance which forms part of the variable high pass filter 24.

Figure 3:
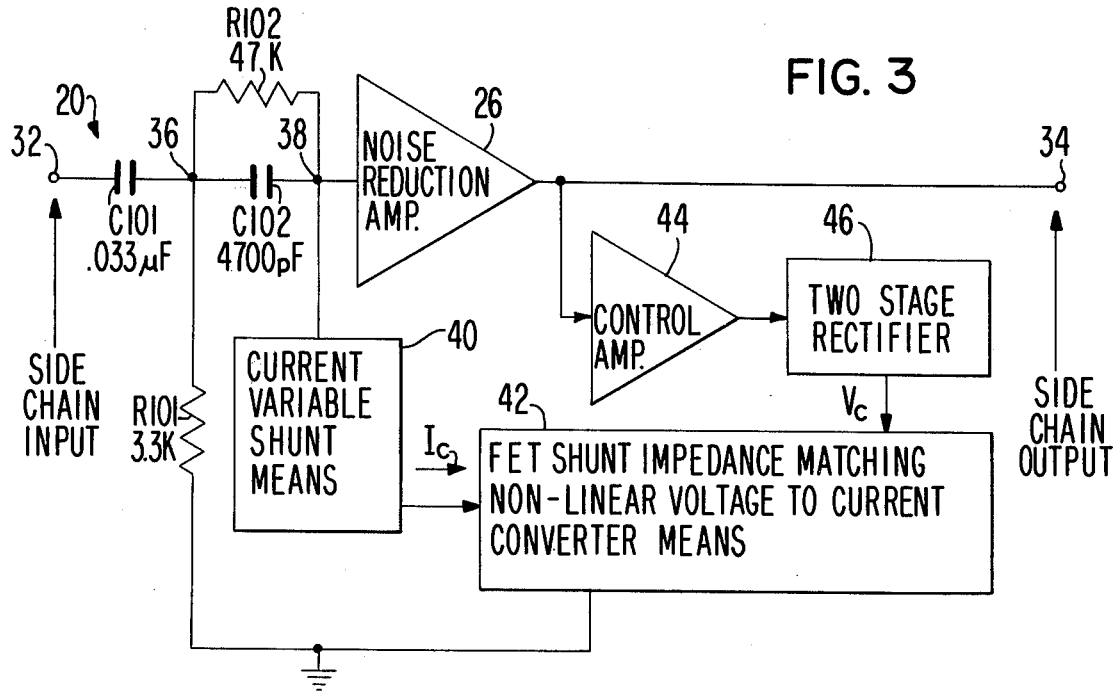
FIG. 3 is a more detailed partial block schematic diagram of the variable high pass filter and amplifier of FIG. 1 incorporating the present invention.

FIG. 3 is a more detailed schematic diagram of the side chain 20 shonw in FIG. 1 incorporating the present invention. The side chain 20 possesses an input terminal 32 and an output terminal 34. The variable high pass filter 24 is of modified two section RC design. The first RC filter section is formed with a 3.3K ohm shunt resistor R101 and a 0.033μF capacitor C101 connected at an intermediate node 36 as shown. This fixed filter section provides 6db per octave attenuation with a turnover frequency of approximately 1700 Hz. The second filter section is formed with a current variable shunt means 40, a 4700pF capacitor C102 and a 47K ohm resistor R102 connected as shown. The output from the filter 24 is provided at an output from the filter 24 is provided at an output terminal 38. The turnover frequency of the filter 24 is controlled by the impedance provided at the output terminal 38 by the current variable shunt means 40 which is a function of a selected control current $I_C$. The current variable shunt means 40 and a non-linear voltage to current converter means 42 function to imitate and replace a junction FET (shown schematically in FIG. 5). This replaced FET is responsive to a control voltage applied to its gate electrode and is used in the commercially popular discrete component embodiment of Dolby D filter 24 to provide a variable shunt impedance at the output terminal 38.

Figure 4:
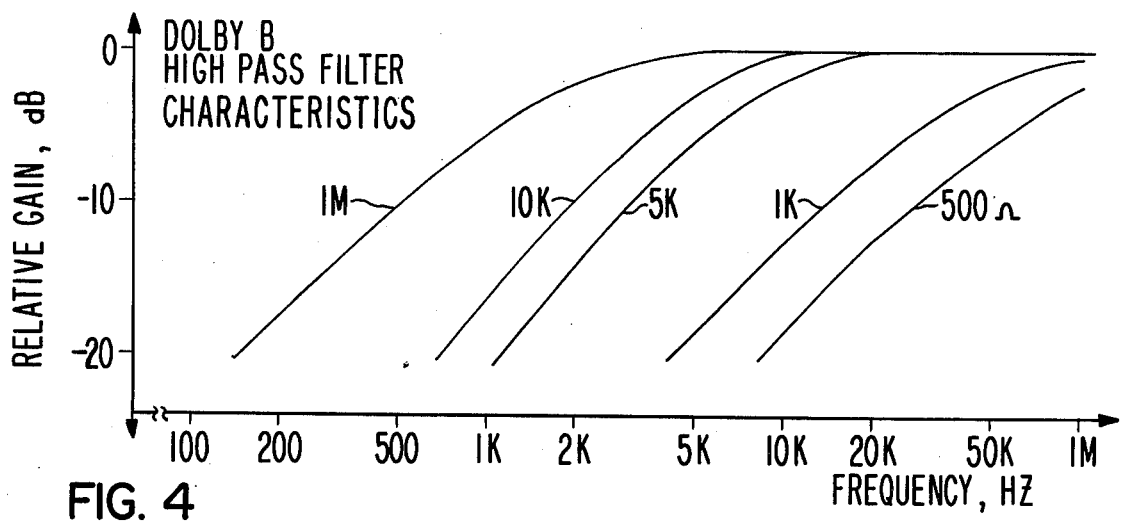
FIG. 4 is a graphical representation of selected response characteristics for the variable high pass filter shown in FIGS. 1 and 3.

Regardless of the means used to provide the shunt impedance at the output terminal 38, FIG. 4 graphically depicts the static performance of the filter 24 at five selected shunt impedance values shown adjacent their respective response curves. A further discussion of the Dolby B variable frequency high pass filter 24 can be found in the Dolby reissue patent referred above.

The selected high frequency signal components which pass through the filter 24 are boosted approximately 10db by the noise reduction amplifier 26 before being fed to the side chain output terminal 34. The noise reduction amplifier 26 has broad band flat response characteristics. The turnover frequency of the filter 24 is varied in response to the character of the audio signals passing through the filter by means of a feedback control loop. This control loop includes control amplifier 44 having an input connected to the side chain output terminal 34 and an output connected to a two-stage rectifier 46 which provides a selected control voltage $V_C$. In the commercially popular discrete component embodiment of the Dolby D variable frequency high pass filter 24, the control voltage $V_C$ is applied to the gate electrode of a junction FET having its source-drain path connected between the output terminal 38 and ground. In the present invention, the high pass filter feedback loop is closed by connecting the control voltage $V_C$ to the non-linear voltage to current converter means 42. The gain of the control amplifier 44 increases with frequency thereby making the control loop more sensitive to high frequencies. The rectifier 46 is of two-stage design to provide both long and short attack times depending on the character of the audio signal. For example, long attack times (approx. 100 msec) are required for low to moderate level signals so that low frequency signals do not modulate the control voltage $V_C$ causing intermodulation distortion. However, short attack times (approx. 1 msec) are required to avoid distortion of large suddenly applied signals, such as a cymbal crash.

Figure 5:
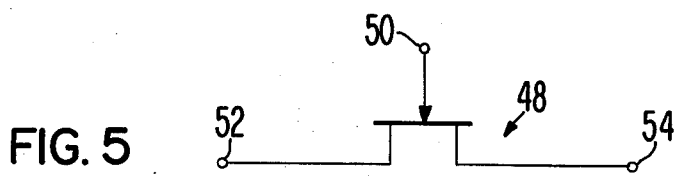
FIG. 5 is a schematic symbol of the junction FET which the present invention is intended to functionally imitate and replace in the FIG. 1 system.

In FIG. 5, a typical junction FET 48 of the type intended to be functionally imitated and replaced by the present invention is shown as a schematic symbol for purposes of contrast and comparison. Such transistors possess a gate electrode 50, a drain 52 and a source 54. Unlike the well-known PNP and NPN junction transistors which operate through the transport of injected minority carriers, a junction FET uses a depletion region of reverse biased p-n junctions to modulate the cross-sectional area available for current flow between the source and the drain. In junction FETS the current is transported by carriers of one polarity only; hence, it is usual to refer to such transistors as unipolar devices in contrast to PNP and NPN junction transistors which are called bipolar devices because they involve both types of carriers. Junction FETS are to be distinguished from surface FETS (e.g., Metal Oxide Semiconductor transistors) to which they are similar in all respects except in the physical mechanism responsible for varying the magnitude of the conducting charge. This magnitude is modulated by the width of a reverse biased depletion region in a junction FET and by the incident surface field in a surface FET.

Two major obstacles discourage the direct incorporation of a junction FET in an integrated circuit embodiment of the Dolby B noise reduction system. First, existing integrated circuit fabricated processes are not wholly compatible with the process used to fabricate junction FETS intended for use in the Dolby B system. Second, in order to obtain the compatibility required by the complementary nature of the Dolby B system, it is currently necessary to sort junction FETS to obtain devices with acceptable performance characteristics. Taken together, these two obstacles dictate that a more manufacturable variable impedance be employed in an integrated circuit embodiment of the Dolby B system. Such an alternative is employed in the prior art Signetics IC and in the present invention.

Figure 6:
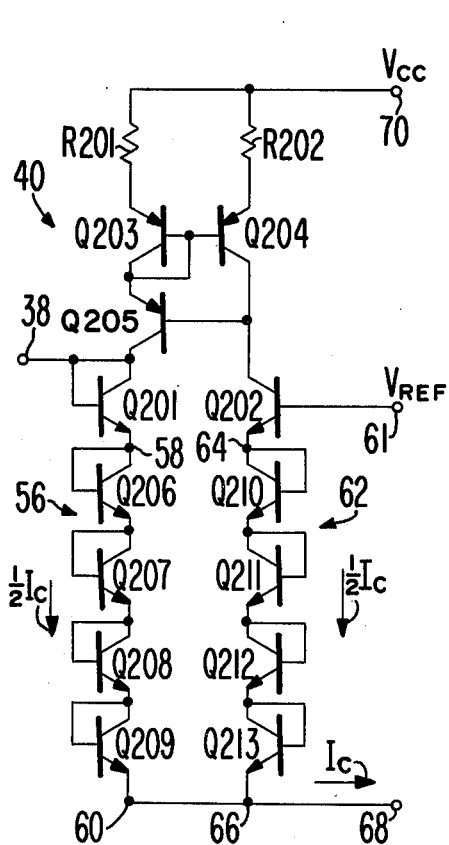
FIG. 6 is a schematic diagram of a presently preferred embodiment of the current variable shunt means shown in FIG. 3.

FIG. 6 is a schematic diagram of a presently preferred embodiment of the current variable shunt means 40. The circuit provides a current variable impedance by utilizing the well-known diode characteristic of the base emitter junction of a bipolar transistor Q201. Any variation in DC emitter current varies the impedance of the junction. The diode connected transistor Q201 is connected as shown at the output terminal 38 of the variable frequency high pass filter 24. Additional diode connected transistors Q206, Q207, Q208 and Q209 are connected in series to form a first diode chain 56 possessing a first end anode 58 and a first end cathode 60. The first end anode 58 is connected to the emitter of the transisitor Q201 to provide a wider range of variable impedance through the use of more diode junctions. A transistor Q202 having its base connected to a source of selected input bias voltage, reference voltage $V_{REF}$, at a terminal 61, is used in combination with a second balanced diode chain 62 to force the DC level at the output terminal 38 to the reference voltage $V_{REF}$. The second diode chain 62 is formed with four diode connected transistors Q210, Q211, Q212 and Q213 connected in series as shown. The second diode chain 62 possesses a second end anode 64 connected to the emitter of the transistor Q202 and a second end cathode 66. The first and second end cathodes 60 and 66 are both connected to a control terminal 68. Although the two balanced diode chains each contain four substantially identical base emitter junctions, those skilled in the art will appreciate that more or fewer junctions can be successfully used.

Unlike the electrically variable impedance taught by Hoeft in his United States Patent referenced above, the circuit of FIG. 6 employs a Wilson current mirror to ensure that substantially one half of a selected control current $I_C$ flows in each of the two diode chains 56 and 62. The Wilson current mirror includes a pair of emitter resistors R201 and R202 and three transistors Q203, Q204 and Q205 connected as shown. A source of supply voltage $V_{CC}$ is applied to the circuit at a terminal 70.

Figure 7:
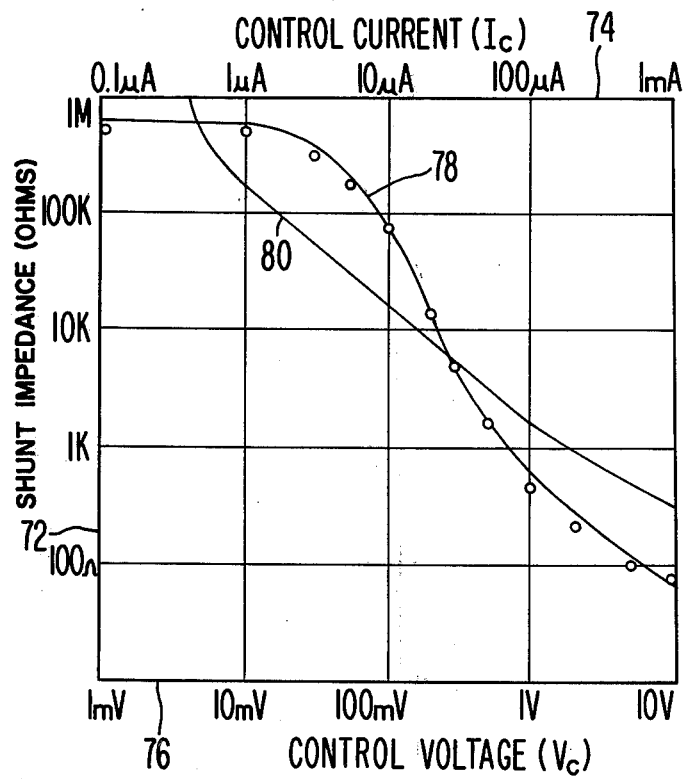
FIG. 7 is a graphical representation of the impedance characteristics of the FIG. 5 junction FET, the FIG. 6 current variable shunt means and the current variable shunt impedance with a non-linear control characteristic of the invention.

FIG. 7 is a graphical representation of the impedance characteristics of the FIG. 5 junction field effect transistor 48, the FIG. 6 current variable shunt means 40 and the current variable shunt impedance with a non-linear control characteristic of the invention. The shunt impedance values for the three apparatuses are plotted logarithmically in ohms against a vertical scale 72. The control current $I_C$ associated with the FIG. 6 current variable shunt means 40 is plotted logarithmically in amps against an upper horizontal scale 74. The control voltage values $V_C$ associated with the FIG. 5 junction FET 48 and the current variable shunt impedance with a non-linear control characteristic of the invention are plotted logarithmically in volts against a lower horizontal scale 76. A curve 78 represents the characteristics associated with the junction FET 48 used in the Dolby B variable frequency high pass filter 24. A curve 80 represents the characteristics associated with the current variable shunt means 40 shown in FIG. 6. Because the curve 78 is plotted against the lower horizontal scale 76 and the curve 80 is plotted against the upper horizontal scale 74, the horizontal relationship between the two curves as shown is arbitrary.

The curve 80 is substantially linear over much of its length. The curve 78 is predominantly non-linear. The prior art Signetics IC employs a current variable impedance in the Dolby B filter 24 similar to the FIG. 6 circuit. No specific attempt was made in that IC to closely match the impedance characteristics of the junction FET. As a result, the static and dynamic AC performance of that embodiment of the Dolby B system does not match the performance of a Dolby B system embodied with discrete components over the entire operating range. This lack of matching results in amplitude errors and transient discrepancies which are not desirable.

The present invention provides shunt impedance characteristics shown as small circles in FIG. 7. It can be seen that these chracteristics conform closely to the discrete junction FET characteristics represented by the curve 78 over the entire range of control voltage values shown.

Figure 8:
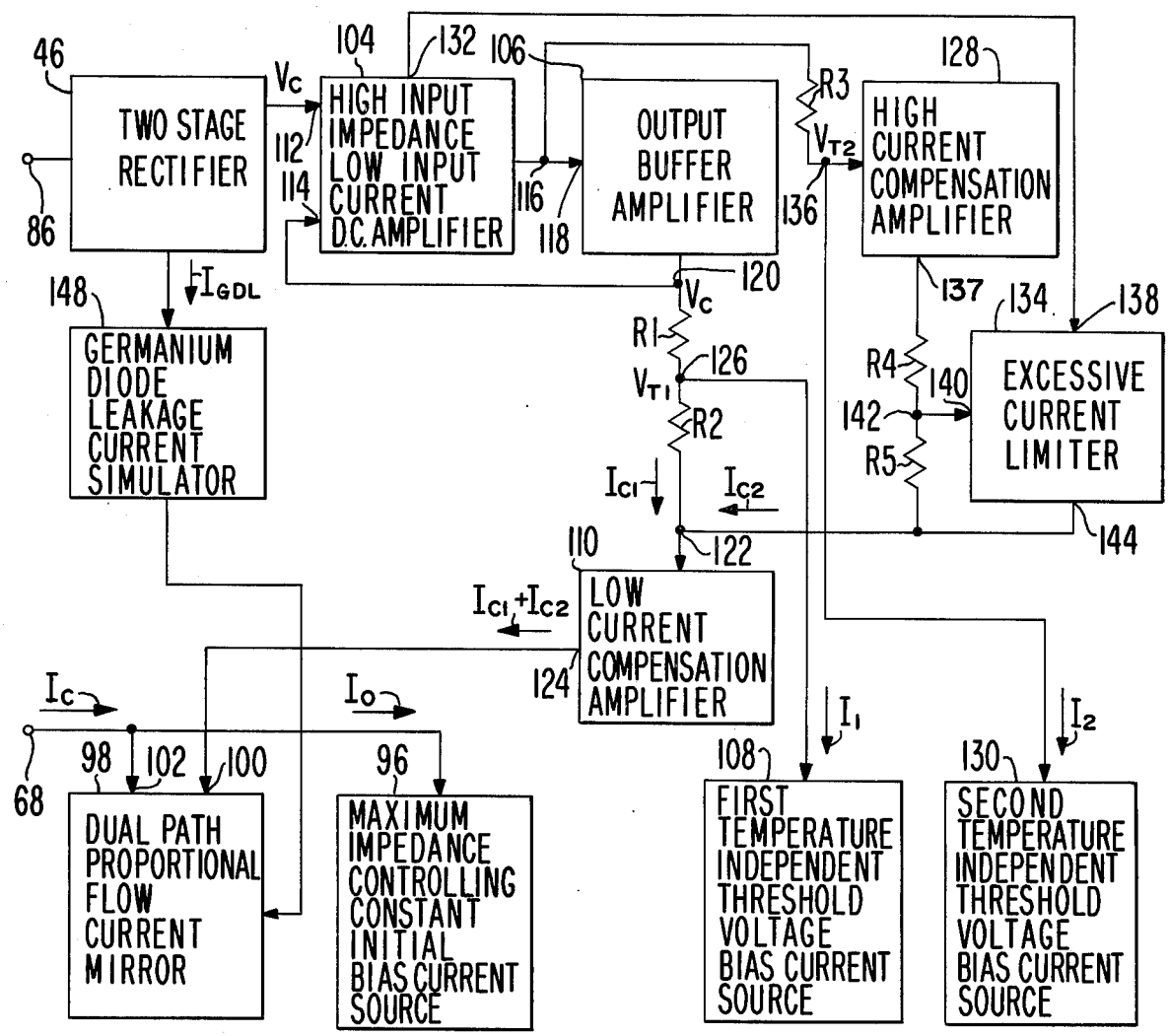
FIG. 8 is a partial schematic diagram of a presently preferred embodiment of the non-linear voltage to current converter means shonw as a block in FIG. 3.
Figure 9:
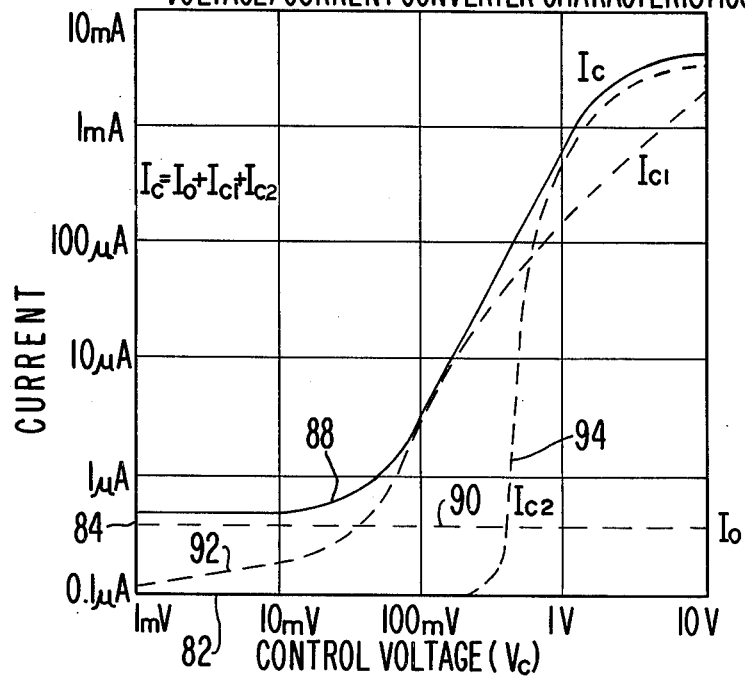
FIG. 9 is a graphical representation of selected currents associated with the non-linear voltage to current converter means shown in FIG. 8.

The operation of the non-linear voltage to current converter means 42 is best understood by concurrent reference to FIGS. 8 and 9. FIG. 8 is a partial schematic diagram of a presently preferred embodiment of the non-linear voltage to current converter means 42 and FIG. 9 is a graphical representation of selected currents shown in FIG. 8. In FIG. 9, the control voltage $V_C$ is plotted against horizontal logarithmic scale 82 and the various currents are plotted against a vertical logarithmic scale 84.

The output from the control amplifier 44 (shown in FIG. 3) is applied at an input terminal 86 on the two-stage rectifier 46. In the discrete component embodiment of the Dolby B system the two-stage rectifier 46 contains a silicon diode and a germanium diode. The presently preferred embodiment of the invention contains a new and novel circuit for simulating the performance of the germanium diode thereby eliminating the need to provide such a diode externally when portions of the Dolby B system are embodied in a chip of silicon semiconductor material. This circuit will be described in greater detail in the discussion of FIG. 10 below. The output from the two-stage rectifier 46 is the control voltage $V_C$.

Simply stated, for each control voltage value $V_C$ the non-linear voltage to current converter means 42 functions to allow a selected control current $I_C$ to flow through the control terminal 68 of the current variable shunt means 40. The magnitude of the selected control current $I_C$ is such that the impedance provided at the output terminal 38 equals the impedance which would have been provided by the source-drain path of a junction FET with the same control voltage value $V_C$ applied to its gate electrode. The desired relationship between the control voltage $V_C$ and the control current $I_C$ required to accomplish this objective is shown graphically by the curve 88. At each control voltage value $V_C$, the non-linear voltage to current converter means 42 provides the desired control current $I_C$ by the additive combination of a constant initial biasing current $I_O$, a first partial control current $I_{C1}$, and a partial control current $I_{C2}$.

The characteristics of the initial biasing current $I_O$ are represented graphically in FIG. 9 by a curve 90. Similarly, the charcteristics of the first and second partial control currents $I_{C1}$ and $I_{C2}$ are represented respectively by curves 92 and 94. Although not immediately apparent in FIG. 9 because of the logarithmic nature of the current scale 84, $I_C = I_O + I_{C1} + I_{C2}$ over the range of control voltage values shown.

At low control voltage values in the discrete component embodiment of the Dolby B filter 24, the maximum impedance at the control terminal 38 is determined by factors other than the impedance of the junction FET. This maximum impedance value at the output terminal 38 is approximately 700K ohms. In the presently preferently embodiment of the invention, the maximum impedance provided by the current variable shunt means 40 is correspondingly limited to 700K ohms by a constant initial biasing current $I_O$ with a value of approximately 0.4μA. This current is provided by a maximum impedance controlling constant initial bias current source 96 connected to the control terminal 68 as shown. A dual path equal flow current mirror 98 is employed as a current source for the balance of the control current $I_C$, ($I_C - I_O = I_{C1} + I_{C2}$). The current mirror 98 possesses input 100 into which the first and second partial control currents $I_{C1}$ and $I_{C2}$ flow. The current mirror 98 functions to allow current to flow into an output 102, shown in FIG. 8 connected to the control terminal 68, equal in magnitude to the current flowing into the input 100.

A low current compensated voltage to current converter means coupled to the control voltage $V_C$ functions to provide at the control terminal 68 an initially restricted and progressively more linear response to increase in the control voltage the first partial control current $I_{C1}$. The low current compensated voltage to current converter means includes a DC differential amplifier 104, an output buffer amplifier 106, first and second selected resistances R1 and R2, a first temperature independent threshhold voltage bias current source 108, a low current compensation amplifier 110 and the dual path equal flow current mirror 98. The differential amplifier 104 has high input impedance and low inout current characteristics and possesses a first input 112, a second inout 114 and an output 116. The first input 112 is connected to the control voltage $V_C$. The output buffer amplifer 106 possesses an input 118 and an output 120. The input 118 is connected to the output 116 of the differential amplifier 104. the control voltage $V_C$ is maintained at the output 120 of the buffer amplifier 106 through a feedback loop connecting that output with the second input 114 of the differential amplifier 104. The low current compensation amplifier possesses an input 122 and an output 124 connected to the input 100 of the current mirror 98. The low current compensation amplifier employs the base-emitter junction diode characteristic of a transistor to initially restrict the flow of current at low current levels and progressively reduce the amount of restriction at higher current levels thereby shaping the first partial control current $I_{C1}$ as shown in FIG. 9. The first and second selected resistances R1 and R2 are connected in series between the output 120 of the buffer amplifier 106 and the input 122 of the low current compensation amplifier 110. The first temperature independent threshold voltage bias current source 108 is connected at the interconnection 126 between the first and second selected resistance R1 and R2. The bias current source 108 provides a constant first threshold current $I_1$ which establishes a first threshold voltage $V_{T1}$, ($I_1$ R1), at the interconnection 126. The values of R1, R2 and $I_1$ are selected to impart the desired characteristics shown in FIG. 9 to the first partial control current $I_{C1}$.

A high current compensation means is connected to the low current compensated voltage to current means for providing the non-linear second partial control current $I_{C2}$ above a pre-determined control voltage value. The high current compensation means includes a high current compensation amplifier 128, a third selected resistance R3, a second temperature independent threshhold voltage bias current source 130, fourth and fifth selected resistances R4 and R5, an output shutdown terminal 132 on the differential amplifier 104 and an excessive current limiter 134. The high current compensation amplifier 128 possesses an input 136 and an output 137. The third selected resistance R3 is connected between the output 116 of the differential amplifier 104 and the input 136 of the high current compensation amplifier 128. The second bias current source 130 is also connected at the input 136 of the amplifier 128 and provides a constant second threshhold current $I_2$ which establishes a second threshhold voltage $V_{T2}$, ($I_2R3$), at the input. The fourth and fifth selected resistances R4 and R5 are connected in series between the output 137 of the high current compensation amplifier 128 and the input 122 of the low current compensation amplifier 110. The excessive current limiter 134 possesses an output 138 connected to the output shutdown terminal 132 on the differential amplifier 104, a current sensing terminal 140 connected to the interconnection 142 of the fourth and fifth resistances R4 and R5 and an output 144 connected to the input 122 of the low current compensation amplifier 110. When the output from the differential amplifier 104 is sufficient to produce a voltage at the input 136 of the amplifier 128 in excess of the second threshhold voltage $V_{T2}$, the second partial control current $I_{C2}$ begins to flow. The fourth and fifth resistances R4 and R5 are selected to impart the desired characteristics shown in FIG. 9 to the second partial control current $I_{C2}$ at high current levels.

Figure 10:
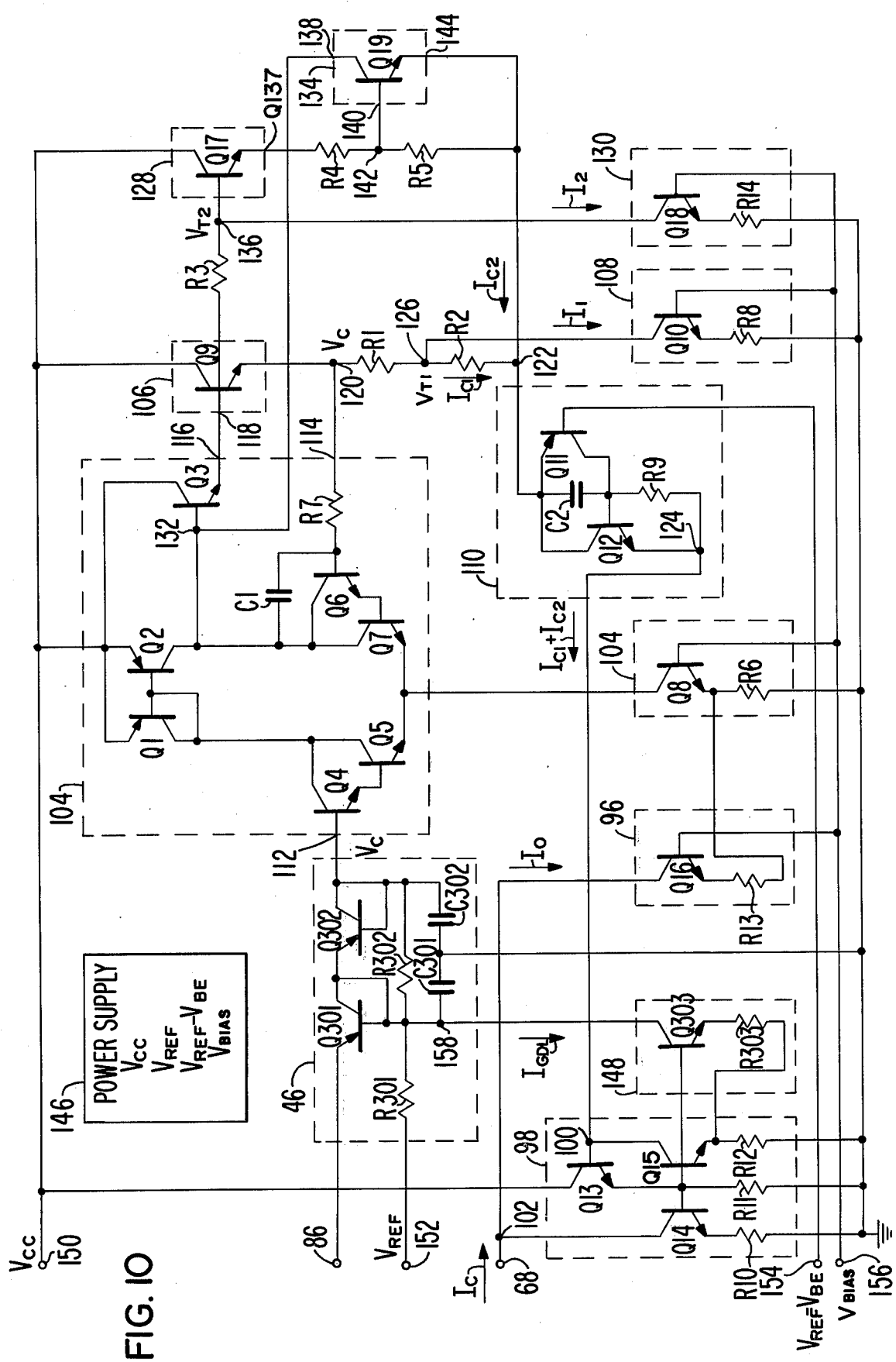
FIG. 10 is a detailed schematic diagram of a presently preferred embodiment of the non-linear voltage to current converter means shown in FIG. 8.

FIG. 10 is a detailed schematic diagram of a presently preferred embodiment of the non-linear voltage to current converter means 42 shown together with a power supply 146, the two-stage rectifier 46, and a germanium diode leakage current simulator 148. In this embodiment, the power supply 146 provides a positive DC supply voltage $V_{CC}$ preferably of 12 volts. $V_{CC}$ is supplied at a terminal 150 as shown. Because it is essential that the Dolby B steady state and transient response characteristics are not adversely affected by either variation in ambient temperature or by variation in chip temperature due to self-heating of the integrated circuit, it is important that the additional selected voltages provided by the power supply 146 possess low thermal coefficients. Additionally, the circuit of FIG. 10 employs concepts intended to guarantee the desired temperature stability. Preferably, the reference voltage $V_{REF}$ has a value of approximately 6.3 volts and a low thermal coefficient of approximately $-2mV/°$ C. A voltage with such characteristics can be derived from a series combination of a zener diode and a diode connected transistor possessing a characteristic base emitter junction threshhold voltage $V_{BE}$ of approximately 600mV. When derived with these components (not shown) $V_{REF}$ can be used to generate the bias voltages $V_{REF} - V_{BE}$ and $V_{BIAS}$ (approximately 1.2 volts) with similar low thermal coefficients. These three voltages are applied respectively at the terminals 152, 154 and 156 as shown.

Because $V_{REF} - V_{BE}$ is used to bias the transistor Q11, the characteristic $-2\text{mV}/^\circ$ C variation in the base emitter voltage of the transistor Q11 is canceled by a similar variation in the biasing voltage.

The first and second threshhold voltage bias currents $I_1$ and $I_2$ are derived from the voltage $V_{BIAS}$ using the transistors Q10 and Q18 and the resistors R8 and R14 connected as shown. This configuration ensures that the currents $I_1$ and $I_2$ are independent of temperature because the characteristic $-2\text{mV}/^\circ$ C variations in the base emitter voltages of the transistors Q10 and Q18 are exactly canceled by the $-2\text{mV}/^\circ$ C variation of $V_{BIAS}$.

Matching the base emitter voltage characteristic of the transistors Q9 and Q17 guarantees the same control voltage $V_C$ at their respective emitters. The $-2\text{mV}/^\circ$ C variation of the transistor Q9 exactly cancels the $-2\text{mV}/^\circ$ C variation of the transistor Q17.

The initial biasing current $I_O$ is inherently temperature independent because the base emitter voltage variations of the transistors Q16 and Q8 cancel each other.

The transistors Q14 and Q15 in the dual path current mirror 98 are identical as are the resistors R10 and R12. This ensures exact tracking of the input and output currents over temperature.

The resistor R7 functions to maintain approximate DC balance withint the differential amplifier formed by the transistors Q4, Q5, Q6 and Q7. Additionally, the resistor R7 functions to prevent a differential DC drift due to variations of transistor Betas with temperature.

All other temperature dependent variations in the circuit are designed to track those that already exist in the discrete Dolby B circuit, i.e., the voltage drop variations in the detector diodes Q301 and Q302.

The two-stage rectifier 46 employs a pair of PNP diodes connected transistors Q301 and Q302 as respective replacements for a germanium diode and a silicon diode used in the discrete component embodiment of the Dolby B system. To simulate the lower threshhold voltage of the replaced germanium diode (approx. 300 milivolts) the DC level at the input terminal 86 is offset approximately 250 milivolts above the reference voltage $V_{REF}$ thereby "pre-biasing" The base-emitter junction of the transistor Q301. This 250 milivolt DC level offset is accomplished at the output of the noise reduction amplifier 26. Because the control amplifier 44 has unity DC gain, the offset is transferred to the input terminal 86. A 0.1μF capacitor C301, a 0.33μF capacitor C302 and a pair of 270K ohm resistors R301 and R302 are connected as shown to complete the two-stage rectifier 46 used in the Dolby B system. In order to closely match the system transient response obtained with a discrete germanium diode, the diode connected transistor Q301 is provided with the germanium diode leakage current simulator 148. This requirement arises from the inherent reverse bias leakage current in the germanium diode which tends to discharge the filter capacitor C301 thereby influencing the decay time of the first rectifier section. The leakage current simulator 148 includes a transistor Q303 and a 100K ohm resistor R303 connected as shown to the dual path equal flow current mirror 98. When a control voltage $V_C$ is built up sufficient to cause the flow of current into the input 100 of the current mirror 98, a small leakage current $I_{GOL}$ flows from a node 158 into the collector of the transistor Q303. $I_{GOL}$ is the "leakage current" which bleeds the rectifier filter capacitor C301, as previously discussed, to approximate the actual leakage current in a germanium diode.

Typical theoretical values for the resistors and capacitors shown throughout the several figures are provided in Table 1 below. All resistance values are in ohms. It is to be understood that these values are only approximate and variations can be made to obtain optimum overall performance of the invention.

Table 1.

| R1 | 1K | R10 | 270 | R301 | 270K |
|----|-----|------|------|------|--------|
| R2 | 4.7K | R11 | 10K | R302 | 270K |
| R3 | 2.2K | R12 | 270 | R303 | 100K |
| R4 | 910 | R13 | 225K | C1 | 3pF |
| R5 | 180 | R14 | 2.2K | C2 | 10pF |
| R6 | 33K | R101 | 3.3K | C101 | .033yF |
| R7 | 200K | R102 | 47K | C102 | 4600pF |
| R8 | 2.1K | R201 | 1K | C301 | .1yF |
| R9 | 10K | R202 | 1K | C302 | .33yF |

The present invention is incorporated in integrated circuit form as part of a monolithic implementation of the Dolby B noise reduction system bearing Fairchild Part No. μA7300.

From the foregoing detailed description, it will be evident that there are a number of changes, adaptions and modifications of the present invention which come within the province of those skilled in the art; however, it is intended that all such variations not departing from the spirit of the invention be considered as within the scope thereof as limited solely by the appended claims.

What is claimed is:

1. In a signal processing system of the Dolby B noise reduction type including a variable frequency high pass filter having a control terminal, a current variable shunt impedance with a non-linear control characteristics operable as a variable impedance shunt resistor at the output terminal of said variable frequency high pass filter comprising: variable shunt means including:
   a source of selected input bias voltage,
   a first transistor possessing a first emitter, a first collector and a first base, said first collector and said first base both connected to said output terminal of said variable frequency high pass filter; a second transistor possessing a second emitter, a second collector and a second base, said second base connected to said source of selected input bias voltage; first and second diode chains each formed from equal pluralities of series connected diodes, said first diode chain possessing a first end anode connected to said first emitter and a first end cathode, said second diode chain possessing a second end anode connected to said second emitter and a second end cathode connected to said first end cathode to form said control terminal:
   current balancing means connected to said first and second collectors for providing currents equal one half and selected control current in each of said first and said second diode chains; and non-linear voltage-to-current converter means responsive to control voltage at a system control terminal for providing system control current in response to voltage from virable shunt means including:

maximum impedance current leakage means connected to said control terminal for providing a constant initial biasing current at said control terminal for providing a constant initial biasing current at said control terminal such that said selected impedance provided by said variable shunt means does not exceed 700K ohms;

low current compensated voltage-to-current converter means coupled to said control voltage for providing in initially restricted and progressively more linear response to increases in said control voltage a first partial control current such that the sum of said initial biasing current and said first partial control current equals the value of said selected control current required by said variable shunt means to provide values of said selected impedance approximating the source drain impedance of said replaced field-effect transistor over a range of control voltage values corresponding to source-drain impedances in the range of 700K to 1K ohms; and high current compensation means connected to said low current compensated voltage-to-current converter means for providing a non-linear second partial control current above a predetermined control voltage value such that the sum of said initial biasing current, said first partial control current sand said second partial control current equals the value of said selected control current required by said variable shunt means to provide values of said selected impedance approximating the source-drain impedance of said replaced field-effect transistor over a range of control voltage values corresponding to source-drain impedances in the range of 1K to 70 ohms.

2. A current variable shunt impedance with a non-linear control characteristic according to claim 1 where said current balancing means comprises:

a power supply of selected voltage;

third, fourth and fifth transistors each possessing a respective emitter, collector and base, said fifth collector connected to said first collector, said fifth base and said fourth collector connected to said second collector, said fifth emitter, said fourth base, said third base and said third collector all connected together;

first and second resistors connected respectively between said third and fourth emitter and said power supply of selected voltage.

3. A current variable shunt impedance with a non-linear control characteristic according to claim 2 wherein said first and second diode chains each possess four series connected diodes.

4. A current variable shunt impedance with a non-linear control characteristic according to claim 1 wherein said low current compensated voltage to current converter means comprises:

a differential amplifier possessing first and second inputs and output, said first input connected to the control voltage;

a buffer amplifier possessing an input and an output connected respectively to said output and said second input of said differential amplifier;

a dual path equal flow current mirror possessing an input and an output, said output of said current mirror connected to said control terminal of said variable shunt means;

a low current compensation amplifier possessing an input and an output connected to said input of said current mirror;

first and second selected resistances connected in series between said output of said output buffer amplifier and said input of said low current compensation amplifier; and a first temperature independent threshhold voltage bias current source connected at the interconnection between said first and said second resistances.

5. A current variable shunt impedance with a non-linear control characteristic according to claim 4 wherein said high current compensation means comprises:

a high current compensation amplifier possessing an input and an output;

a third selected resistance connected between said output of said differential amplifier and said input of said high current compensation amplifier;

a second temperature independent threshhold voltage bias current course connected to said input of said high current compensation amplifier;

fourth and fifth selected resistances connected in series between said output of said high current compensation amplifier and said input of said low compensation amplifier;

an output shutdown terminal on said differential amplifier;

an excessive current limiter possessing an input connected to said output shutdown terminal on said differential amplifier, a current sensing terminal connected to the interconnection of said fourth and said fifth resistances, and an output connected to said input of said low current compensation amplifier.

* * * * *